(12) United States Patent
Tsai et al.

(10) Patent No.: US 12,557,674 B2
(45) Date of Patent: Feb. 17, 2026

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Tsung-Fu Tsai, Changhua County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/743,027

(22) Filed: Jun. 13, 2024

(65) Prior Publication Data

US 2024/0339415 A1 Oct. 10, 2024

Related U.S. Application Data

(63) Continuation of application No. 17/872,028, filed on Jul. 25, 2022, now Pat. No. 12,046,561, which is a
(Continued)

(51) Int. Cl.
*H01L 23/538* (2006.01)
*H01L 23/48* (2006.01)
(Continued)

(52) U.S. Cl.
CPC ........ *H01L 23/5389* (2013.01); *H01L 23/481* (2013.01); *H01L 23/49838* (2013.01); *H01L 23/5226* (2013.01); *H01L 23/5383* (2013.01); *H01L 25/0652* (2013.01); *H01L 25/50* (2013.01)

(58) Field of Classification Search
CPC .................................................. H01L 23/5389
See application file for complete search history.

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| CN | 109727964 | 5/2019 |

OTHER PUBLICATIONS

"Office Action of China Counterpart Application", issued on Jun. 6, 2025, p. 1-p. 8.
(Continued)

*Primary Examiner* — William A Harriston
(74) *Attorney, Agent, or Firm* — JCIPRNET

(57) ABSTRACT

A structure including a first semiconductor die, an interposer and a first insulating encapsulation is provided. The first semiconductor die includes a semiconductor substrate, an interconnect structure disposed on the semiconductor substrate and conductive vias disposed on the interconnect structure. The interposer includes a dielectric layer and through vias penetrating through the dielectric layer. The first insulating encapsulation laterally encapsulates the first semiconductor die and the interposer, wherein a thickness of the dielectric layer of the interposer substantially equals to a thickness of the first semiconductor die and a thickness of the first insulating encapsulation.

20 Claims, 19 Drawing Sheets

Related U.S. Application Data continuation of application No. 16/899,595, filed on Jun. 12, 2020, now Pat. No. 11,450,615.

(51) Int. Cl.
*H01L 23/498* (2006.01)
*H01L 23/522* (2006.01)
*H01L 25/00* (2006.01)
*H01L 25/065* (2023.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,134,677 B1 * | 11/2018 | Chang Chien ...... H01L 23/5383 |
| 10,157,864 B1 | 12/2018 | Yu et al. |
| 2010/0133704 A1 | 6/2010 | Marimuthu et al. |
| 2012/0248622 A1* | 10/2012 | Sadaka ............ H01L 21/76898 |
| | | 438/455 |
| 2014/0110856 A1* | 4/2014 | Lin ....................... H01L 25/105 |
| | | 257/774 |
| 2015/0279922 A1 | 10/2015 | Chang et al. |
| 2019/0027441 A1* | 1/2019 | Chen ................... H01L 23/5389 |
| 2019/0131241 A1 | 5/2019 | Jeng et al. |
| 2019/0148340 A1 | 5/2019 | Yu et al. |

OTHER PUBLICATIONS

"Office Action of China counterpart Application", issued on Dec. 13, 2025, p. 1-p. 9.

* cited by examiner

PACKAGE STRUCTURE AND METHOD OF FABRICATING THE SAME

CROSS-REFERENCE TO RELATED APPLICATION

This application is a continuation application of and claims the priority benefit of a prior application Ser. No. 17/872,028, filed on Jul. 25, 2022 and now allowed. The prior application Ser. No. 17/872,028 is a continuation application of and claims the priority benefit of a prior application Ser. No. 16/899,595, filed on Jun. 12, 2020 and now U.S. Pat. No. 11,450,615 B2. The entirety of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, integrated fan-out packages are becoming increasingly popular for their multi-functions, compactness and high performance. However, there are challenges (e.g., warpage issue) related to integrated fan-out technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
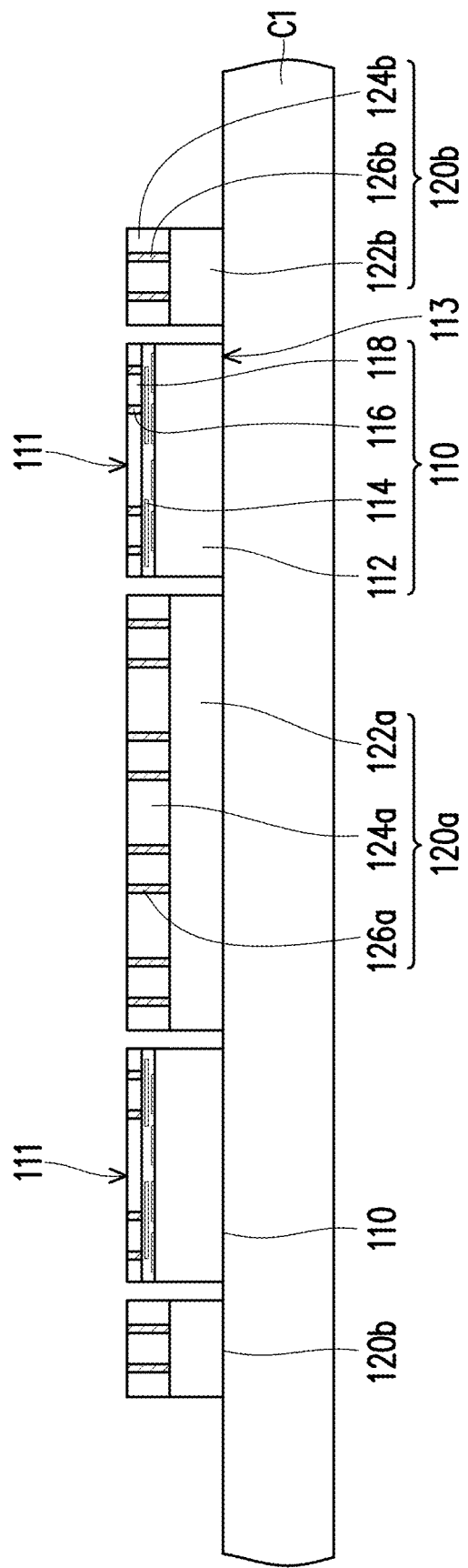
FIG. 1A through FIG. 1I are cross-sectional views schematically illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1I are cross-sectional views schematically illustrating a process flow for fabricating a package structure in accordance with some embodiments of the present disclosure.

Referring to FIG. 1A, a carrier C1 is provided. In some embodiments, the carrier C1 having a de-bonding layer (not shown) formed thereon is provided. In some embodiments, the carrier C1 is a wafer form glass substrate, the de-bonding layer is a light-to-heat conversion (LTHC) release layer formed on the wafer form glass substrate. The materials of the carrier C1 and the de-bonding layer are not limited in the present invention. In some alternative embodiments, the de-bonding layer formed on the carrier C1 may be omitted.

In some embodiments, semiconductor dies 110, at least one interposer die 120a and interposer dies 120b are provided and disposed over the carrier C1. The semiconductor dies 110, the at least one interposer die 120a and the interposer dies 120b may be substantially identical in thickness. The semiconductor dies 110, the at least one interposer die 120a and the interposer dies 120b disposed on the carrier C1 may be arranged side-by-side. The semiconductor dies 110, the at least one interposer die 120a and the interposer dies 120b may be mounted on the carrier C1 through die attachment films, adhesive or the like. As illustrated in FIG. 1A, the at least one interposer die 120a may be disposed between the semiconductor dies 110, the left one of the semiconductor dies 110 is disposed between the at least one interposer die 120a and the left one of the interposer dies 120b, and the right one of the semiconductor dies 110 is disposed between the at least one interposer die 120a and the right one of the interposer dies 120b. In some alternative embodiments, the interposer dies 120b are omitted.

The semiconductor dies 110 may be singulated from semiconductor wafers fabricated by a series of semiconductor processes. The semiconductor dies 110 may each include a semiconductor substrate 112, an interconnect structure 114, conductive vias 116 and a protection layer 118. The semiconductor dies 110 may each include an active surface 111 and a back surface 113 opposite to the active surface 111. The semiconductor substrate 112 may be a silicon substrate including active components (e.g., transistors or the like) and passive components (e.g., resistors, capacitors, inductors, or the like) formed therein. The active components and passive components are formed in the semiconductor substrate 112 through front end of line (FEOL) fabrication processes of the semiconductor wafer. The interconnect structure 114 is disposed on the semiconductor substrate 112. The interconnect structure 114 may include interconnect wirings (e.g., copper interconnect wirings) and dielectric layer stacked alternately, wherein the interconnect wirings of the interconnect structure 114 are electrically connected to the active components and/or the passive components in the semiconductor substrate 112. The interconnect structure 114 is formed through back end of line (BEOL) fabrication processes of semiconductor wafer. The topmost interconnect wirings may include conductive pads, and the conductive pads may be aluminum pads, copper pads, or other suitable metallic pads. The interconnect structure 114 may further include a passivation layer, wherein the conductive pads are partially covered by the passivation layer. In other words, the conductive pads are partially revealed from the openings defined in the passivation layer. The passivation may be a silicon oxide layer, a silicon nitride layer, a silicon oxy-nitride layer, or a dielectric layer formed by other suitable inorganic dielectric materials. The interconnect structure 114 may further include a post-passivation layer formed over the passivation layer, wherein the post-passivation layer covers the passivation layer and the conductive pads, the post-passivation layer includes a plurality of contact openings, and the conductive pads are partially revealed from the contact openings defined in the post passivation layer. The post-passivation layer may be a polyimide (PI) layer, a PBO layer, or a dielectric layer formed by other suitable organic dielectric materials. In some embodiments, the post-passivation layer is omitted.

In some embodiments, as illustrated in FIG. 1A, the conductive vias 116 penetrate through the protection layer 118, the top surfaces of the conductive vias 116 are revealed, and the height of the conductive vias 116 is substantially equal to the thickness of the protection layer 118. The conductive vias 116 may be copper vias or other suitable metallic vias, and the protection layer 118 may be a polyimide (PI) layer, a PBO layer, or a dielectric layer formed by other suitable organic dielectric materials. The conductive vias 116 may be formed over the interconnect structure 114 first, a dielectric material may be formed over the interconnect structure 114 to cover the conductive vias 116, and then a grinding process (e.g., a chemical mechanical polishing process, a mechanical grinding process, combinations thereof or the like) may be performed to remove portions of the dielectric material until the top surfaces of the conductive vias 116 are revealed.

In some alternative embodiments, not illustrated in FIG. 1A, the conductive vias is covered by the protection layer, the top surfaces of the conductive vias are not revealed, and the height of the conductive vias is less than the thickness of the protection layer.

In some embodiments, the at least one interposer dies 120a may be singulated from a semiconductor wafer fabricated by a series of semiconductor processes, and the interposer dies 120b may be singulated from another semiconductor wafer fabricated by a series of semiconductor processes. In some alternative embodiments, the at least one interposer dies 120a and the interposer dies 120b may be singulated from a single semiconductor wafer.

The at least one interposer die 120a may include a semiconductor substrate 122a, a dielectric layer 124a disposed over the semiconductor substrate 122a and through vias 126a penetrating through the dielectric layer 124a. The semiconductor substrate 122a may be a bare silicon substrate and there is no active component (e.g., transistor or the like) and passive component (e.g., resistor, capacitor, inductor, or the like) formed therein. The dielectric layer 124a may be molding compound, underfill material, molded underfill material, a polyimide (PI) layer, a PBO layer, or a dielectric layer formed by other suitable organic dielectric materials. For example, the molding compound includes epoxy resin. Furthermore, the through vias 126a may be copper vias or other suitable metallic vias.

In some embodiments, as illustrated in FIG. 1A, the through vias 126a penetrate through the dielectric layer 124a, the top surfaces of the through vias 126a are revealed, and the height of the through vias 126a is substantially equal to the thickness of the dielectric layer 124a. The dielectric layer 124a may be molding compound, underfill material, molded underfill material, a polyimide (PI) layer, a PBO layer, or a dielectric layer formed by other suitable organic dielectric materials. For example, the molding compound includes epoxy resin. Furthermore, the through vias 126a may be copper vias or other suitable metallic vias. The through vias 126a may be formed over the semiconductor substrate 122a first, a dielectric material may be formed over the semiconductor substrate 122a to cover the through vias 126a, and then a grinding process (e.g., a chemical mechanical polishing process, a mechanical grinding process, combinations thereof or the like) may be performed to remove portions of the dielectric material until the top surfaces of the through vias 126a are revealed.

In some alternative embodiments, not illustrated in FIG. 1A, the through vias is covered by the dielectric layer, the top surfaces of the through vias are not revealed, and the height of the through vias is less than the thickness of the dielectric layer.

The interposer dies 120b may each include a semiconductor substrate 122b, a dielectric layer 124b disposed over the semiconductor substrate 122b and through vias 126b penetrating through the dielectric layer 124b. The semiconductor substrate 122b may be a bare silicon substrate and there is no active component (e.g., transistor or the like) and passive component (e.g., resistor, capacitor, inductor, or the like) formed therein. The dielectric layer 124b may be molding compound, underfill material, molded underfill material, a polyimide (PI) layer, a PBO layer, or a dielectric layer formed by other suitable organic dielectric materials. For example, the molding compound includes epoxy resin. Furthermore, the through vias 126b may be copper vias or other suitable metallic vias.

In some embodiments, as illustrated in FIG. 1A, the through vias 126b penetrate through the dielectric layer 124b, the top surfaces of the through vias 126b are revealed, and the height of the through vias 126b is substantially equal to the thickness of the dielectric layer 124*b*. The dielectric layer 124*b* may be molding compound, underfill material, molded underfill material, a polyimide (PI) layer, a PBO layer, or a dielectric layer formed by other suitable organic dielectric materials. For example, the molding compound includes epoxy resin. Furthermore, the through vias 126*b* may be copper vias or other suitable metallic vias. The through vias 126*b* may be formed over the semiconductor substrate 122*b* first, a dielectric material may be formed over the semiconductor substrate 122*b* to cover the through vias 126*b*, and then a grinding process (e.g., a chemical mechanical polishing process, a mechanical grinding process, combinations thereof or the like) may be performed to remove portions of the dielectric material until the top surfaces of the through vias 126*b* are revealed.

In some alternative embodiments, not illustrated in FIG. 1A, the through vias is covered by the dielectric layer, the top surfaces of the through vias are not revealed, and the height of the through vias is less than the thickness of the dielectric layer.

As illustrated in FIG. 1A, the at least one interposer die 120*a* and the interposer dies 120*b* are similar except that the lateral dimension of the at least one interposer die 120*a* is greater than that of the interposer dies 120*b*.

The thickness of the semiconductor substrates 112 in the semiconductor dies 110 may be greater than the thickness of the semiconductor substrates 122*a* and 122*b* in the interposer dies 120*a* and 120*b*. The thickness of the semiconductor substrates 112 in the semiconductor dies 110 may range from about 100 micrometers to about 780 micrometers, and the semiconductor substrates 122*a* and 122*b* in the interposer dies 120*a* and 120*b* may range from about 80 micrometers to about 760 micrometers. In other words, the top surface of the semiconductor substrate 112 may be higher than the top surfaces of the semiconductor substrates 122*a* and 122*b*. Furthermore, the sum of the height of the conductive vias 116 and the thickness of the interconnect structure 114 may be less than the thickness of the dielectric layers 124*a* and 124*b*, or the sum of the height of the conductive vias 116 and the thickness of the interconnect structure 114 may be less than the height of the through vias 126*a* and 126*b*.

Figure 1B:
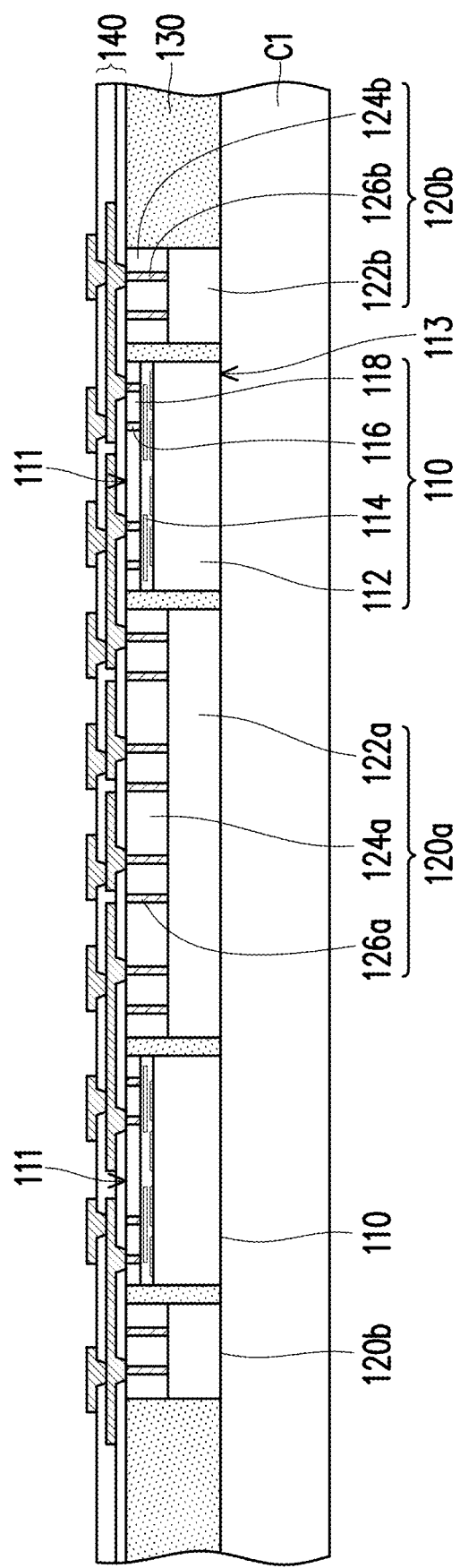

Referring to FIG. 1B, an insulating material may be formed by an over-molding process or a film deposition process. After performing the over-molding process or film deposition process, a grinding process may be performed to partially remove the insulating material until the conductive vias 116 of the semiconductor dies 110 as well as the through vias 126*a* and 126*b* of the interposer dies 120*a* and 120*b* are revealed. After the grinding process of the insulating material, an insulating encapsulation 130 is formed over the carrier C1 to laterally encapsulate the semiconductor dies 110, the interposer die 120*a* and the interposer dies 120*b*. In some embodiments, the grinding process for partially removing the insulating material includes a mechanical grinding process, a chemical mechanical polishing (CMP) process, combinations thereof or the like. For example, the material of the insulating encapsulation 130 includes molding compound, underfill material, molded underfill material or other suitable dielectric materials. For example, the molding compound includes epoxy resin.

After performing the grinding process of the insulating material, the top surface of the insulating encapsulation 130 may be substantially leveled with the top surfaces of the conductive vias 116, the protection layer 118, the dielectric layer 124*a*, the through vias 126*a*, the dielectric layers 124*b* and the through vias 126*b*. In some alternative embodiments, due to grinding selectivity, the top surface of the insulating encapsulation 130 may be slightly higher than or slightly lower than the top surfaces of the conductive vias 116, the protection layer 118, the dielectric layer 124*a*, the through vias 126*a*, the dielectric layers 124*b* and the through vias 126*b*.

Since the interposer die 120*a*, the interposer dies 120*b* and the semiconductor dies 110 have similar coefficient of thermal expansion (CTE) as well as less amount of the insulating encapsulation 130 is utilized to laterally encapsulate the semiconductor dies 110, the interposer die 120*a* and the interposer dies 120*b*, warpage of an encapsulated structure including the semiconductor dies 110, the interposer die 120*a*, the interposer dies 120*b* and the insulating encapsulation 130 may be minimized. Furthermore, since the encapsulated structure have a thickness of about 130 micrometers to about 810 micrometers, and warpage of the thick encapsulated structure may be minimized. In some embodiments, CTE of the semiconductor dies 110 ranges from about 2 to about 6, CTE of the interposer dies 120*a* and 120*b* ranges from about 2 to about 6, CTE of the insulating encapsulation 130 ranges from about 5 to about 35.

A front side redistribution circuit layer 140 may be formed to cover the active surfaces 111 of the semiconductor dies 110, the top surface of the interposer die 120*a*, the top surfaces of the interposer dies 120*b* and the top surface of the insulating encapsulation 130. The front side redistribution circuit layer 140 may be formed over the top surfaces of the insulating encapsulation 130, the conductive vias 116, the protection layer 118, the dielectric layer 124*a*, the through vias 126*a*, the dielectric layers 124*b* and the through vias 126*b*. The front side redistribution circuit layer 140 may include multiple layers of redistribution wirings and multiple insulating layers stacked alternately, wherein the redistribution wirings are embedded in the insulating layers, and the redistribution wirings are electrically connected to the conductive vias 116, the through vias 126*a* and the through vias 126*b*. The redistribution wirings of the front side redistribution circuit layer 140 may be copper redistribution wirings, and the insulating layers of the front side redistribution circuit layer 140 may be polyimide (PI), PBO, silicon oxide layers, silicon nitride layers, silicon oxy-nitride layers, combinations thereof or the like.

Since warpage of the encapsulated structure is minimized, risk of defects of the redistribution circuit layer 140 caused by pits formed in the insulating encapsulation 130 may be lowered.

Figure 1C:
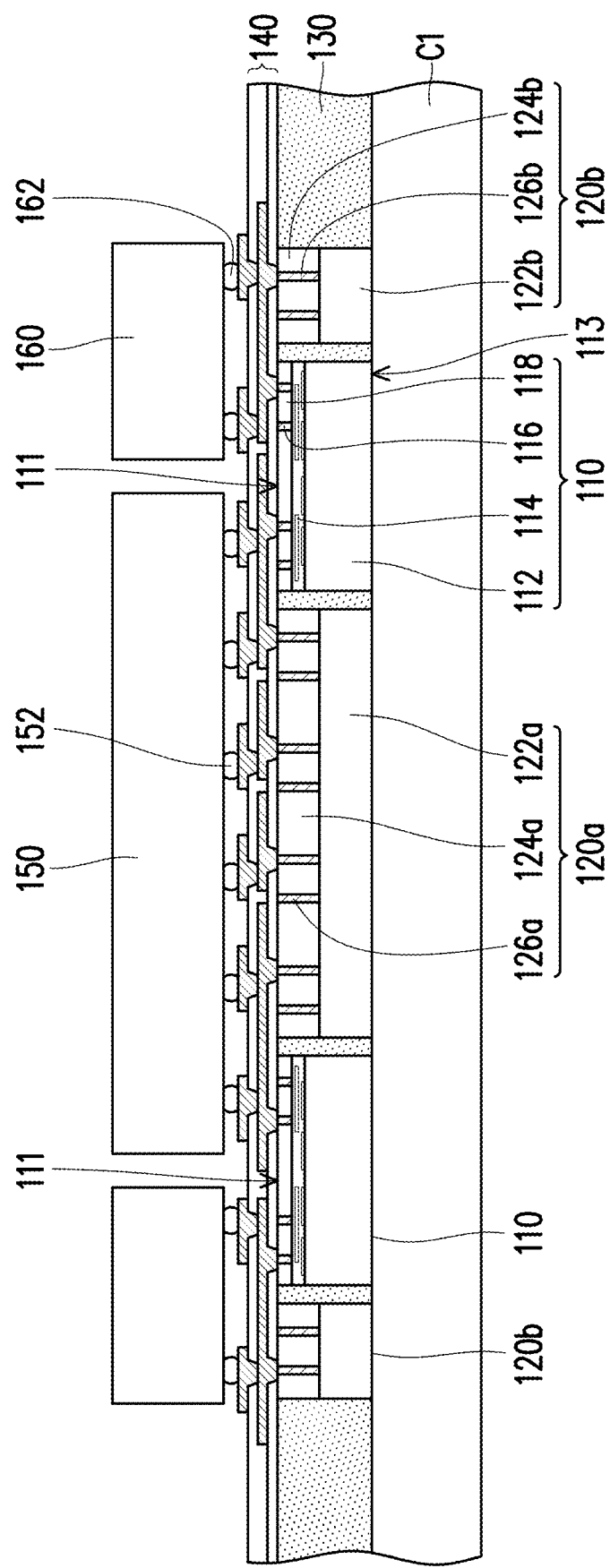

Referring to FIG. 1C, at least one semiconductor die 150 having bumps 152 formed thereon and memory devices 160 having bumps 162 are provided. The semiconductor 150 and the memory devices 160 are mounted onto the redistribution circuit structure 140 and electrically connected the redistribution circuit structure 140 through the bumps 152 and the bumps 162, respectively. In some embodiments, the semiconductor die 150 may be a System-on-Chip (SoC) die, and the memory devices 160 may be high bandwidth memory (HBM) cubes including stacked memory dies. Since warpage of the resulted structure illustrated in FIG. 1B is minimized, yield of bump joint between the redistribution circuit layer 140 and the semiconductor die 150 as well as yield of bump joint between the redistribution circuit layer 140 and the memory devices 160 may be better.

Figure 1D:
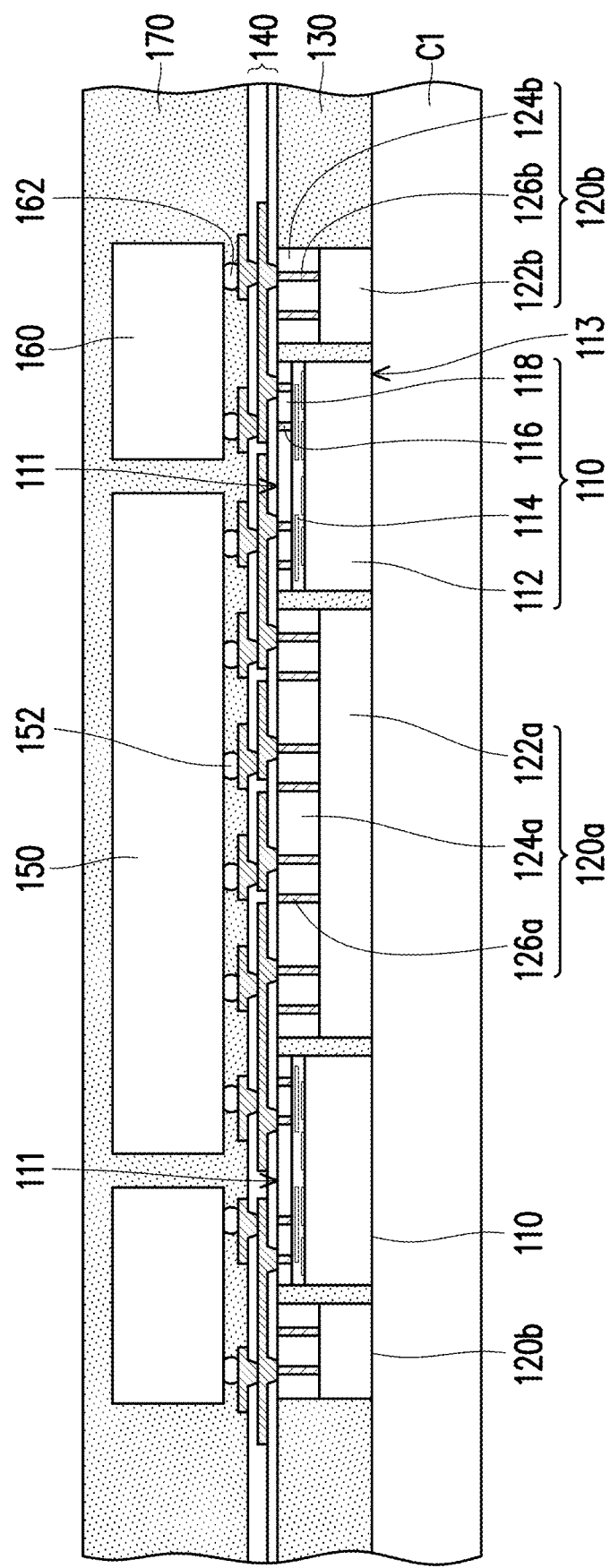

Referring to FIG. 1D, an insulating encapsulation 170 is formed on the redistribution circuit structure 140 to cover the semiconductor die 150 and memory devices 160. The insulating encapsulation 170 may be formed by an over-molding process or a film deposition process, and the material of the insulating encapsulation 170 may include molding compound, underfill material, molded underfill material or other suitable dielectric materials. For example, the molding compound includes epoxy resin. In some embodiments, the material of the insulating encapsulation 170 is the same as that of the insulating encapsulation 130. In some alternative embodiments, the material of the insulating encapsulation 170 is different from that of the insulating encapsulation 130. The thickness of the insulating encapsulation 130 may be less than the thickness of the insulating encapsulation 170. For example, the thickness of the insulating encapsulation 170 ranges from about 100 micrometers to about 1000 micrometers, and the thickness of the semiconductor die 150 and memory devices 160 ranges from about 50 micrometers to about 800 micrometers.

Figure 1E:
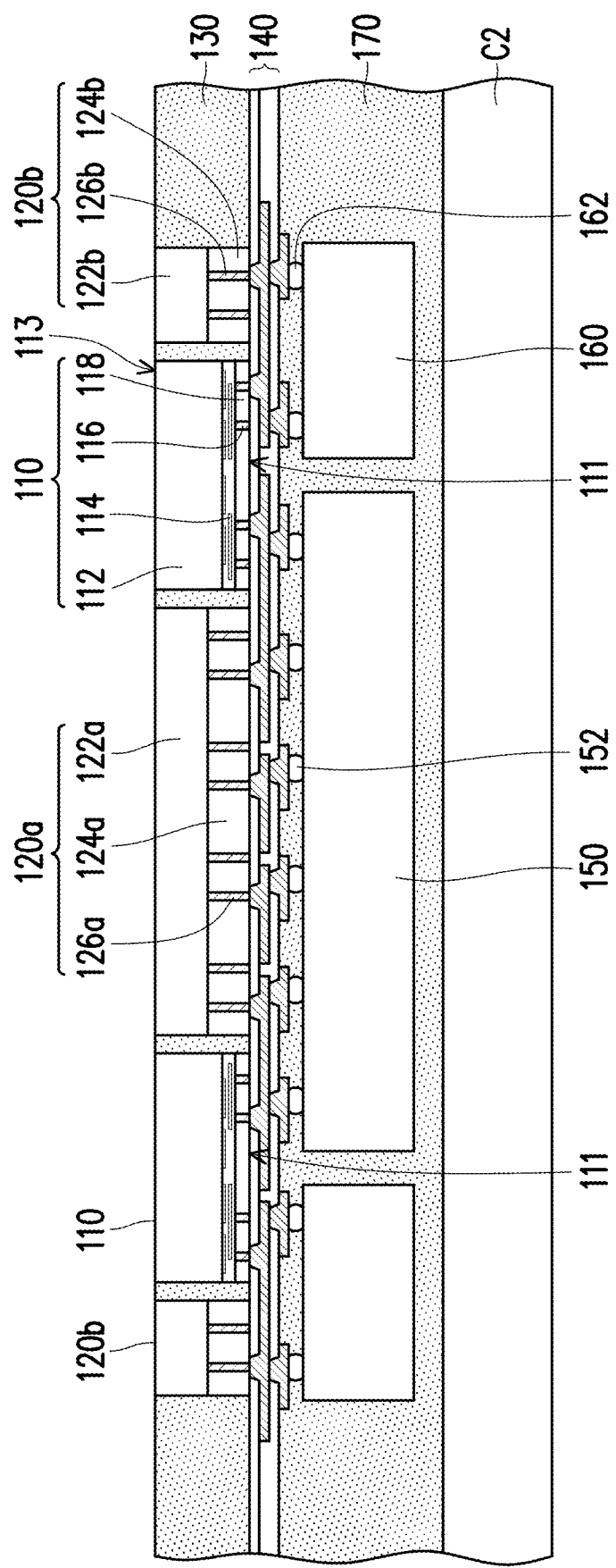

Referring to FIG. 1D and FIG. 1E, the resulted structure illustrated in FIG. 1D is flipped upside down and mounted onto another carrier C2 such that the insulating encapsulation 170 is bonded to the carrier C2. A de-bonding process is performed such that the carrier C1 is de-bonded from the semiconductor dies 110, the interposer die 120*a*, the interposer dies 120*b* and the insulating encapsulation 130. After performing the de-bonding process, the semiconductor substrates 112 of the semiconductor dies 110, the semiconductor substrate 122*a* of the interposer die 120*a* and the semiconductor substrates 122*b* of the interposer dies 120*b* are revealed.

Figure 1F:
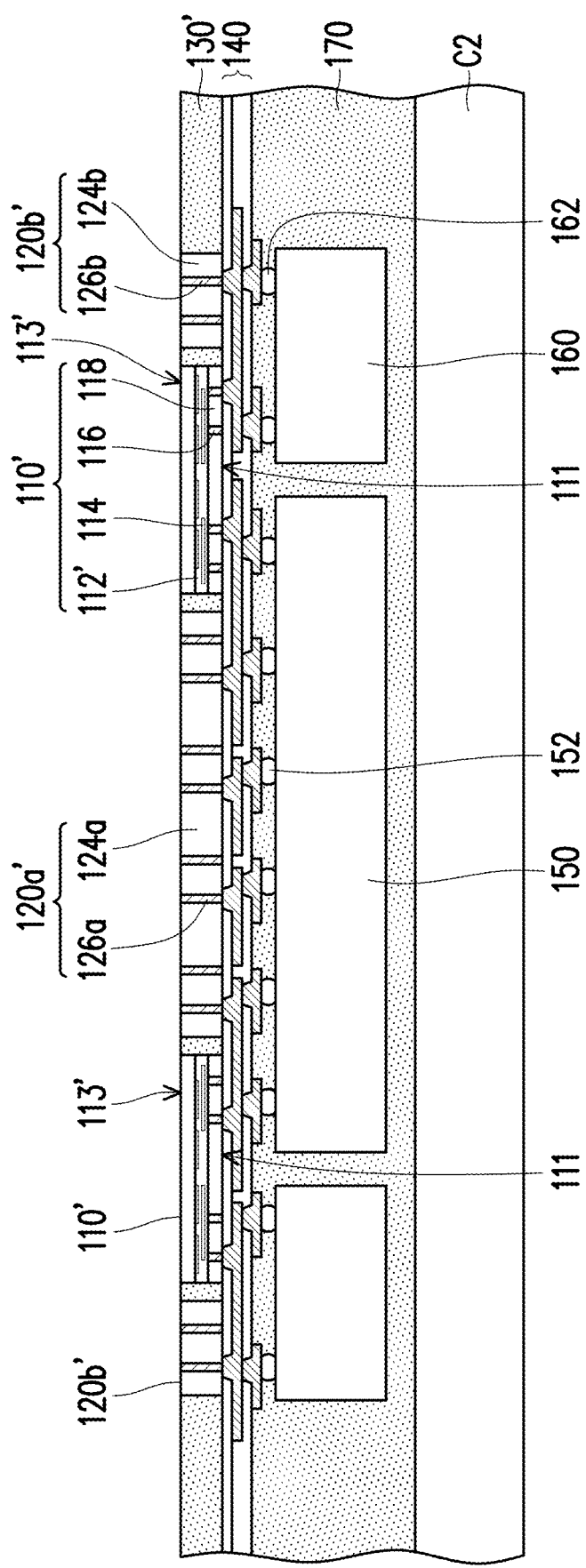

Referring to FIG. 1E and FIG. 1F, a thinning process is performed to remove the semiconductor substrate 122*a*, the semiconductor substrate 122*b*, a portion of the semiconductor substrate 112 and a portion of the insulating encapsulation 130 until the through vias 126*a*, the through via 126*b*, the dielectric layer 124*a* and the dielectric layers 124*b* are revealed. In some embodiments, the above-mentioned thinning process includes a mechanical grinding process, a chemical mechanical polishing (CMP) process, combinations thereof or the like. After performing the thinning process, semiconductor dies 100' having reduced thickness, a dielectric interposer 120*a*', dielectric interposers 120*b*' and insulating encapsulation 130' are formed, wherein the semiconductor dies 100', the dielectric interposer 120*a*' and the dielectric interposers 120*b*' are laterally encapsulated by the insulating encapsulation 130'. The semiconductor dies 110' may each include a semiconductor substrate 112', an interconnect structure 114, conductive vias 116 and a protection layer 118. The semiconductor dies 110' may each include an active surface 111 and a back surface 113' opposite to the active surface 111. The dielectric interposer 120*a*' may include the dielectric layer 124*a* and the through vias 126*a* penetrating through the dielectric layer 124*a*. The dielectric interposers 120*b*' may each include the dielectric layer 124*b* and the through vias 126*b* penetrating through the dielectric layer 124*b*. The thickness of the semiconductor dies 110', the dielectric interposer 120*a*', the dielectric interposers 120*b*' and the insulating encapsulation 130' may be substantially identical and range from about 15 micrometers to about 100 micrometers. Furthermore, the thickness of the semiconductor substrates 112' in the semiconductor dies 110' may range from about 5 micrometers to about 90 micrometers.

As illustrated in FIG. 1F, the through vias 126*a* of the dielectric interposer 120*a*' are spaced apart from the insulating encapsulation 130' by the dielectric layer 124*a*, and the through vias 126*b* of the dielectric interposer 120*b*' are spaced apart from the insulating encapsulation 130' by the dielectric layer 124*b*. In other words, the through vias 126*a* of the dielectric interposer 120*a*' and the through vias 126*b* of the dielectric interposer 120*b*' are not in contact with the insulating encapsulation 130'.

Figure 1G:
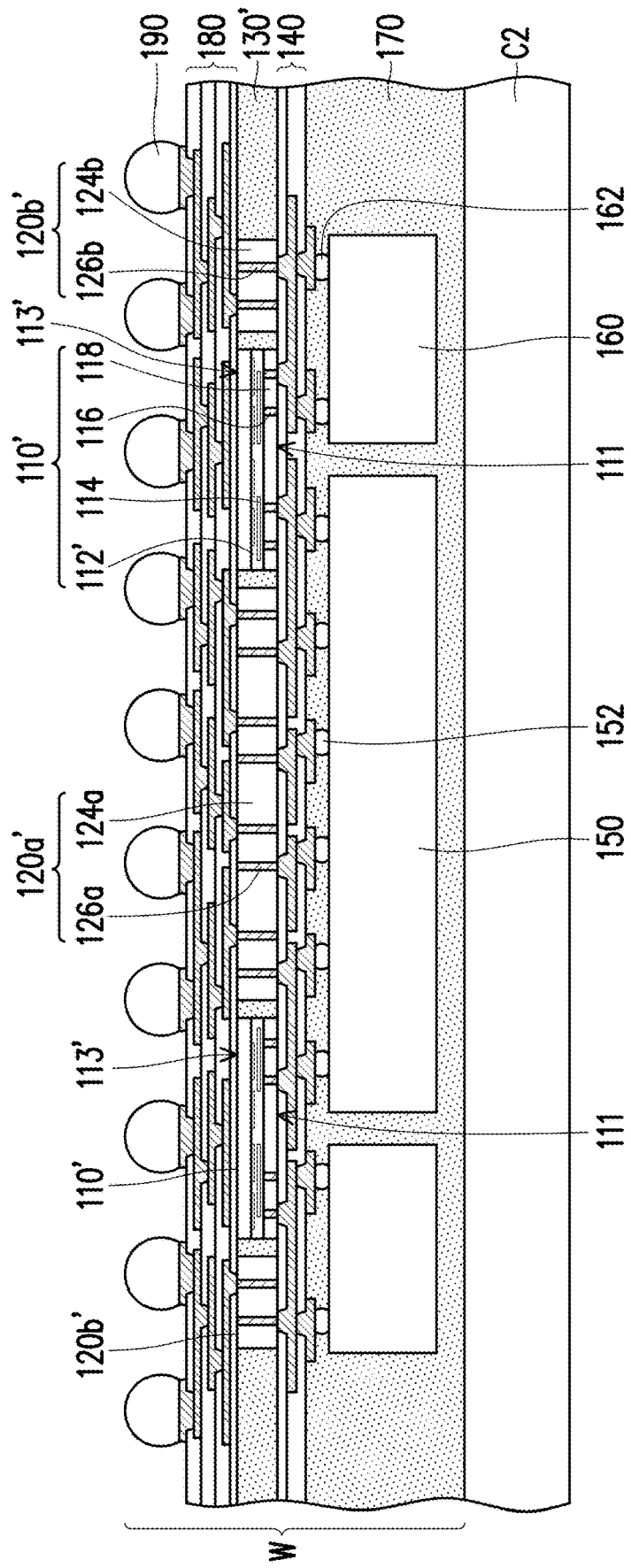

Referring to FIG. 1F and FIG. 1G, a back-side redistribution circuit layer 180 may be formed to cover the back surfaces 113' of the semiconductor dies 110', the revealed surface of the interposer die 120*a*', the revealed surfaces of the interposer dies 120*b*' and the revealed surface of the insulating encapsulation 130'. The back-side redistribution circuit layer 180 may be formed over the revealed surfaces of the insulating encapsulation 130', the semiconductor substrate 112', the dielectric layer 124*a*, the through vias 126*a*, the dielectric layers 124*b* and the through vias 126*b*. The back-side redistribution circuit layer 180 may include multiple layers of redistribution wirings and multiple insulating layers stacked alternately, wherein the redistribution wirings are embedded in the insulating layers, and the redistribution wirings are electrically connected to the through vias 126*a* and the through vias 126*b*. The redistribution wirings of the back-side redistribution circuit layer 180 may be copper redistribution wirings, and the insulating layers of the back-side redistribution circuit layer 180 may be polyimide (PI), PBO, silicon oxide layers, silicon nitride layers, silicon oxy-nitride layers, combinations thereof or the like.

In some embodiments, the semiconductor dies 110' are electrically connected to the redistribution circuit layer 180 through the redistribution circuit layer 140, the through vias 126*a* of the dielectric interposer 120*a*' and/or the through vias 126*b* of the dielectric interposers 120*b*'. Conductive terminals 190 are formed on the back-side redistribution circuit layer 180. The conductive terminals 190 are electrically connected to the redistribution wirings of the back-side redistribution circuit layer 180. The conductive terminals 360 may include solder balls (e.g., lead free solder balls) arranged in array. After forming the redistribution circuit layer 180 and the conductive terminals 190, a reconstructed wafer W is formed over the carrier C2.

Figure 1H:
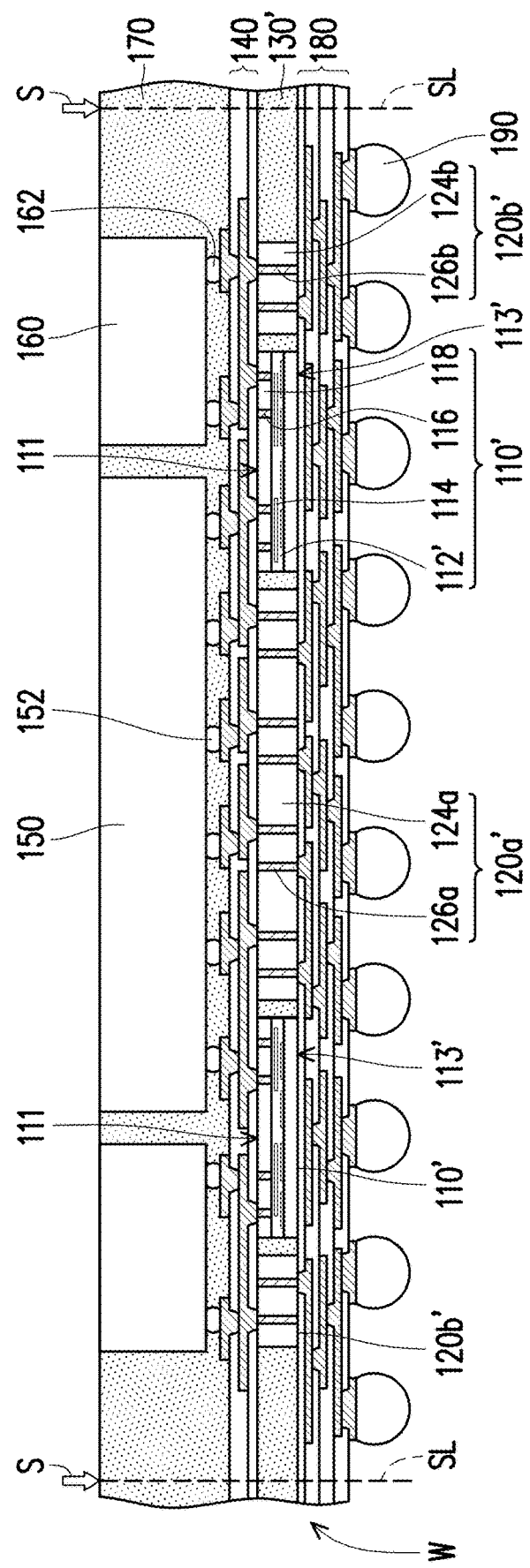
Figure 1I:
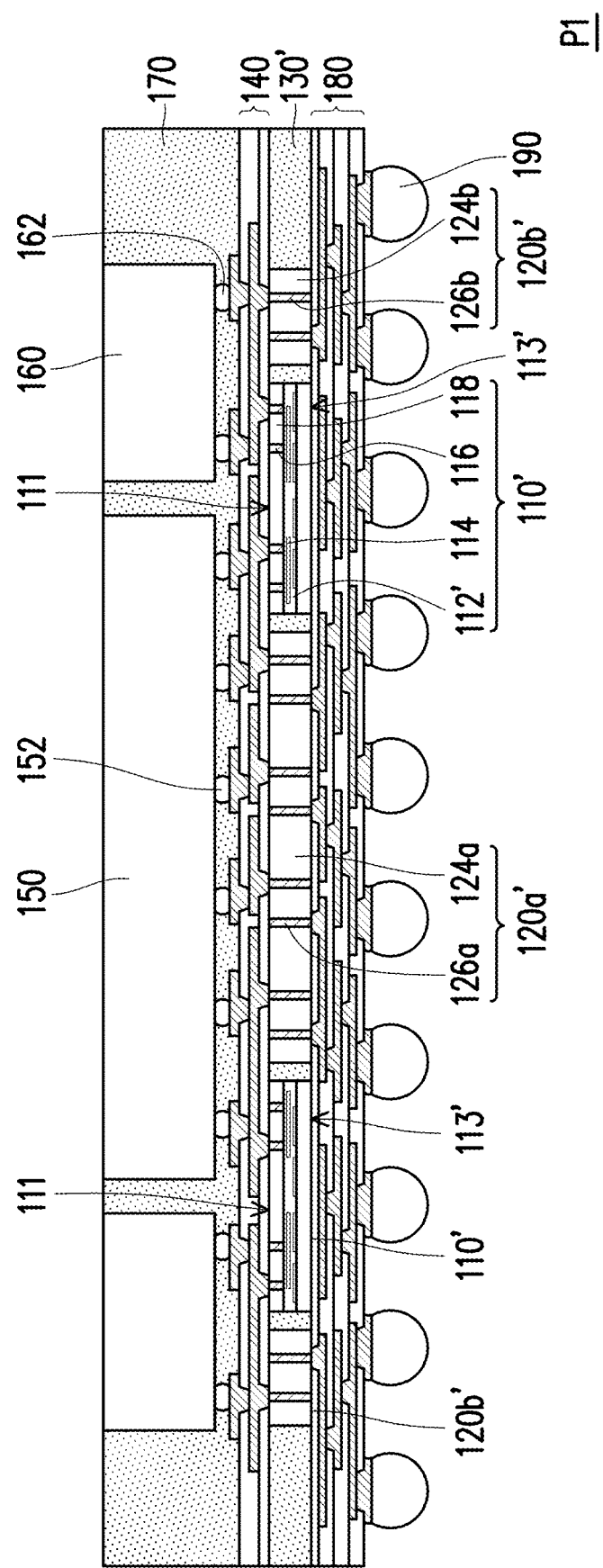

Referring to FIG. 1G through FIG. 1I, a singulation process (i.e. a wafer saw process) is performed along the scribe line SL such that the reconstructed wafer W is singulated into multiple package structures P1.

As illustrated in FIG. 1I, the package structure P1 may include at least one semiconductor die 110', at least one dielectric interposer 120*a*' and an insulating encapsulation 130'. The package structure P1 may further include dielectric interposer 120*b*'. Two semiconductor dies 110', one dielectric interposer 120*a*' and two dielectric interposer 120*b*' are illustrated in FIG. 1I, however, the number of the semiconductor dies 110' and the interposer 120*a*' and 120*b*' is not limited in the present invention. The semiconductor dies 110' each includes a semiconductor substrate 112', an interconnect structure 114 disposed on the semiconductor substrate 112' and conductive vias 116 disposed on the interconnect structure 114. The dielectric interposer 120*a*' includes a dielectric layer 124*a* and through vias 126*a* penetrating through the dielectric layer 124*a*. The insulating encapsulation 130' laterally encapsulates the semiconductor die 110' and the interposer, wherein a thickness of the dielectric layer 124*a* of the dielectric interposer 120*a*' substantially equals to a thickness of the semiconductor die 110' and a thickness of the insulating encapsulation 130'.

The semiconductor die 110' may further include a protection layer 118 disposed on the interconnect structure 140 and laterally encapsulating the conductive vias 116. The dielectric interposer 120*a*' may be spaced apart from the semiconductor die 110' by the insulating encapsulation 130'. The package structure P1 may further include a front side redistribution circuit layer 140 disposed on a surface (e.g., an upper surface) of the insulating encapsulation 130', active surfaces 111 of the semiconductor die 110' and surfaces (e.g., upper surfaces) of the dielectric interposers 120a' and 120b', wherein the front side redistribution circuit layer 140 is electrically connected to the conductive vias 116 of the semiconductor die 110', the through vias 126a of the dielectric interposers 120a' and the through vias 126b of the dielectric interposer 120b'. In some embodiments, the package structure P1 may further include a back side redistribution circuit layer 180 disposed on another surface (e.g., a lower surface) of the insulating encapsulation 130', back surfaces 113' of the semiconductor die 110' and another surfaces (e.g., lower surfaces) of the dielectric interposer 120a' and 120b', wherein the back side redistribution circuit layer 180 is electrically connected to the front side redistribution circuit layer 130 through the through vias 126a of the dielectric interposers 120a' and 120b'.

In some embodiments, the package structure P1 further includes a semiconductor die 150 and an insulating encapsulation 170. The semiconductor die 150 is disposed on and electrically connected to the front side redistribution circuit layer 140, and the insulating encapsulation 170 is disposed on the front side redistribution circuit layer 140 and laterally encapsulating the semiconductor die 150. In addition, the package structure P1 may further include memory devices 160 laterally encapsulated by the insulating encapsulation 170.

Figure 2:
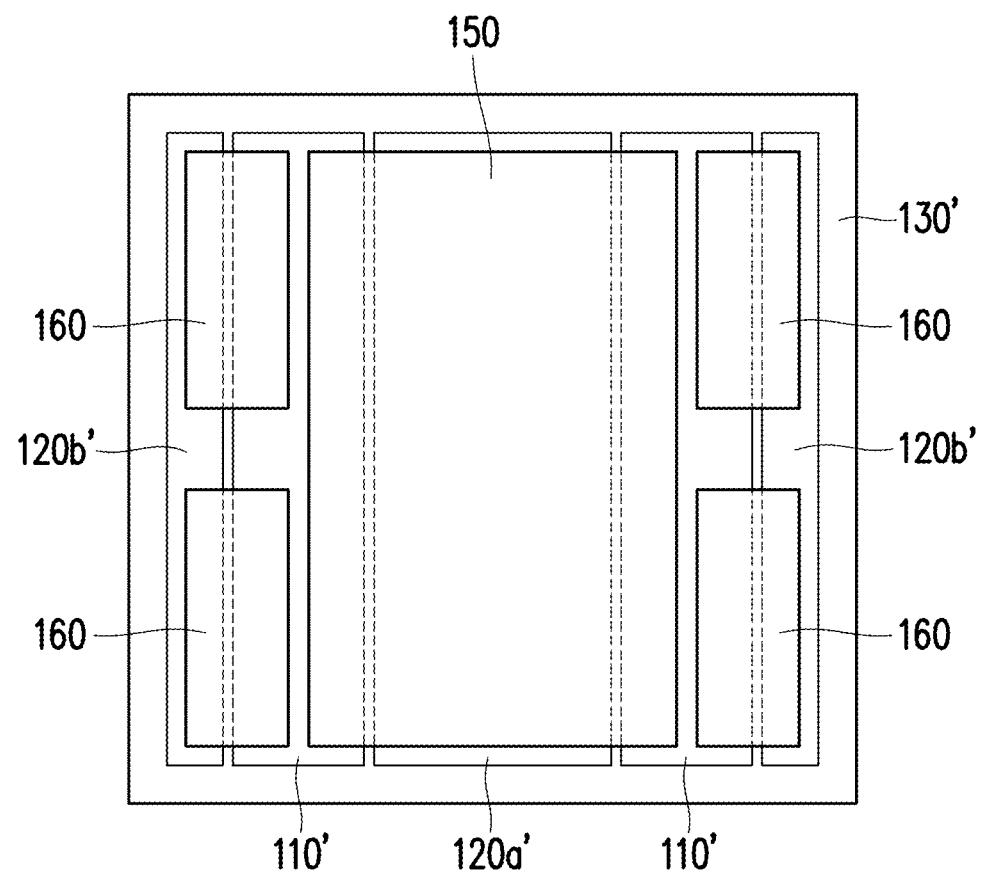
FIG. 2 is a top view schematically illustrating a package structure in accordance with some embodiments of the present disclosure.

FIG. 2 is a top view schematically illustrating a package structure in accordance with some embodiments of the present disclosure.

Referring to FIG. 1I and FIG. 2, in the package structure P1, the semiconductor die 150 and the memory devices 160 are stacked over the semiconductor dies 110', the dielectric interposers 120a' and 120b' encapsulated by the insulating encapsulation 130'. When viewing from atop, the semiconductor dies 110', the dielectric interposer 120a' and dielectric interposers 120b' are arranged within a rectangular region surrounded by the insulating encapsulation 130'. When viewing from atop, the semiconductor dies 110' are overlapped with the semiconductor die 150 and the memory devices 160, the dielectric interposer 120a' is merely overlapped with the semiconductor die 150, and the dielectric interposers 120b' are merely overlapped with the memory devices 160. When viewing from atop, the memory devices 160 are overlapped with semiconductor dies 110' and the dielectric interposers 120b', and the semiconductor die 150 is overlapped with the semiconductor dies 110' and the dielectric interposer 120a'.

Figure 3:
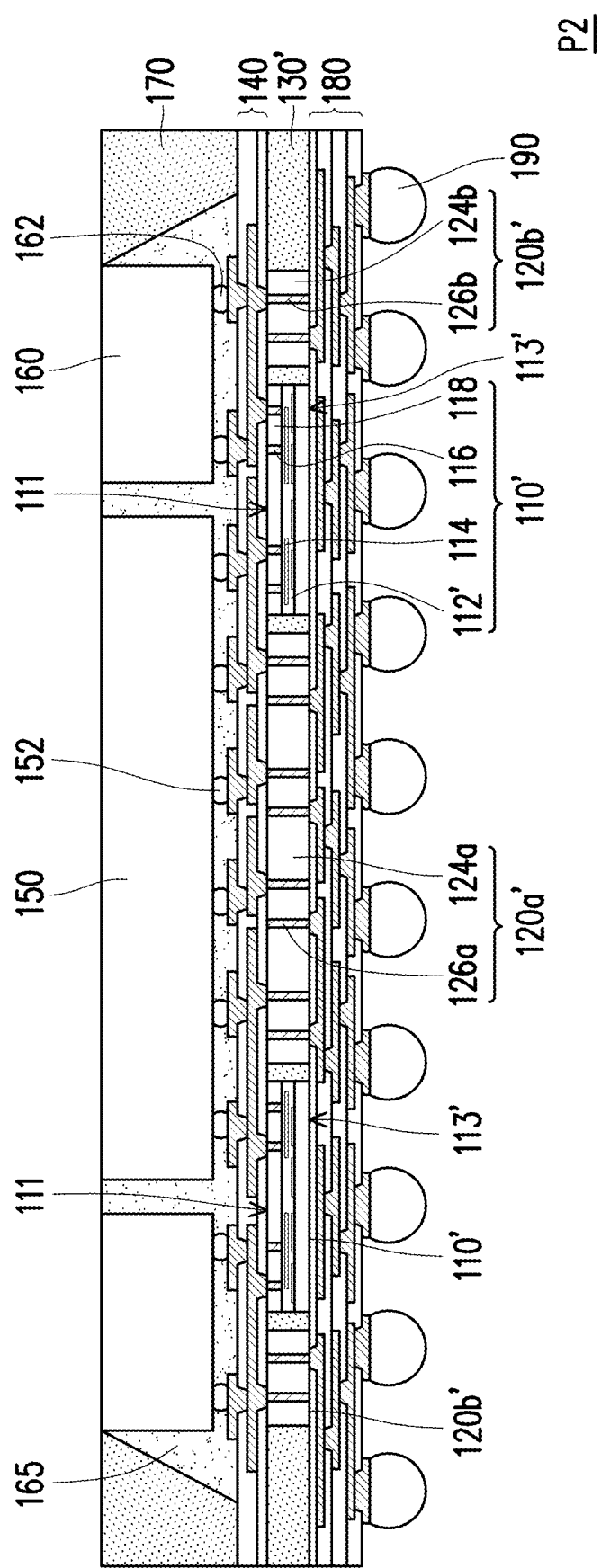
FIGS. 3 through 5 are cross-sectional views schematically illustrating package structures in accordance with various embodiments of the present disclosure.
Figure 4:
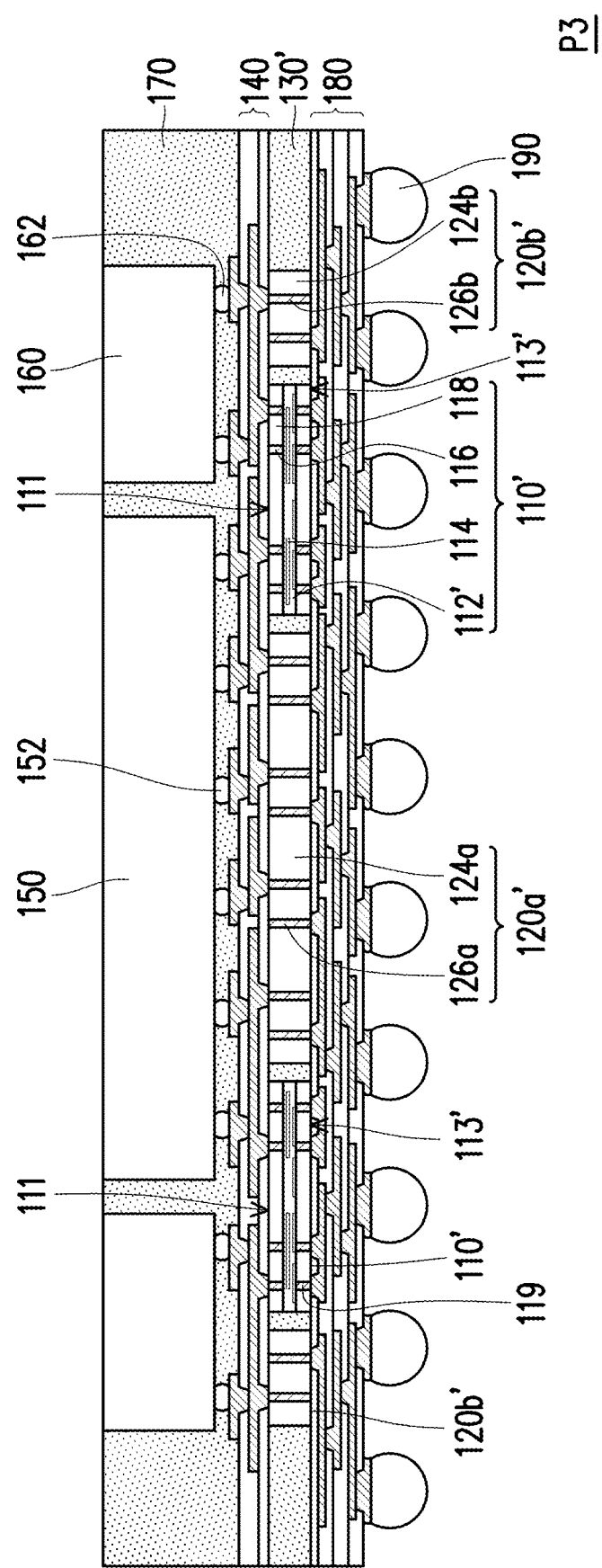
Figure 5:
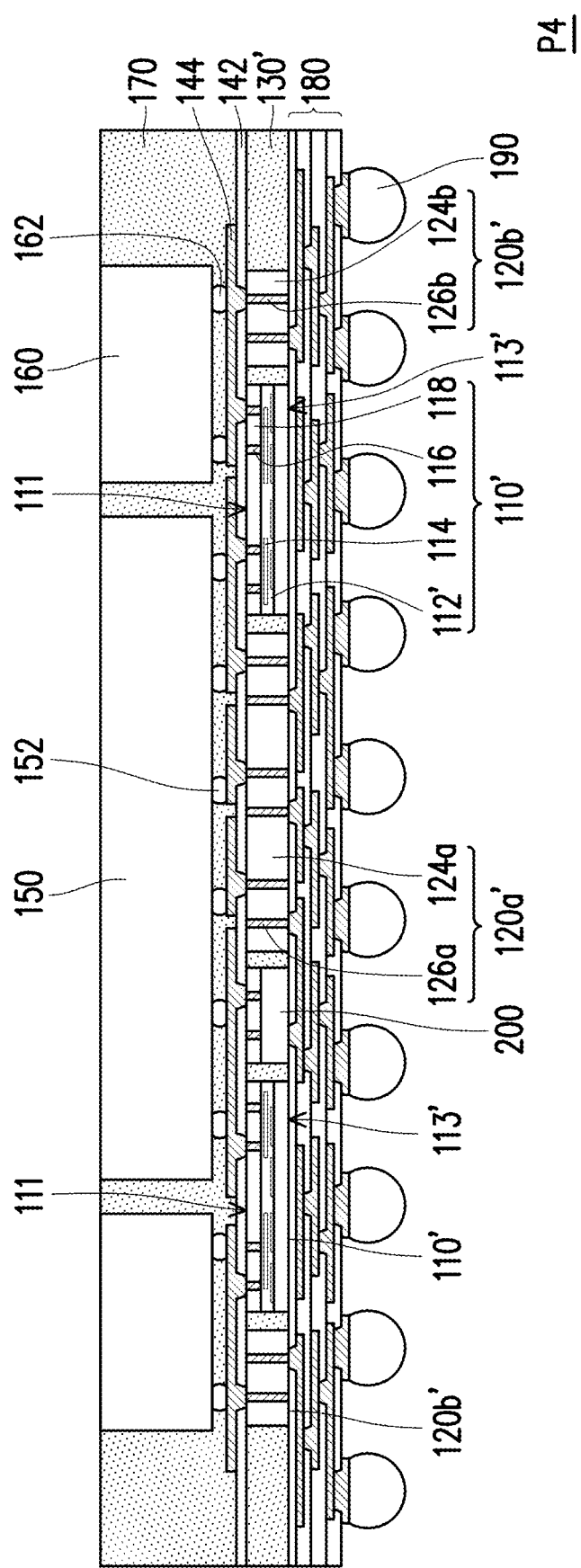

FIGS. 3 through 5 are cross-sectional views schematically illustrating package structures in accordance with various embodiments of the present disclosure.

Referring to FIG. 1I and FIG. 3, the package structure P2 illustrated in FIG. 3 is similar with the package structure P1 illustrated in FIG. 1I except that the package structure P2 further includes an underfill 165 laterally encapsulating the semiconductor die 150 and the memory devices 160, wherein the semiconductor die 150 and the memory devices 160 are spaced apart from the insulating encapsulation 130' by the underfill 165. The underfill 165 may serve as a stress buffer for the bumps 152 and 162, and the reliability of the bump joint may be improved accordingly.

Referring to FIG. 4, the package structure P3 illustrated in FIG. 4 is similar with the package structure P1 illustrated in FIG. 1I except that the semiconductor die 110' in the package structure P3 further includes through semiconductor vias 119 penetrating through the semiconductor substrate 112', and the through semiconductor vias 119 are electrically connected to the interconnect structure 114.

Referring to FIG. 5, the package structure P4 illustrated in FIG. 5 is similar with the package structure P1 illustrated in FIG. 1I except that the package structure P4 further includes at least one passive device 200 embedded in the insulating encapsulation 130', wherein a thickness of the passive device 200 substantially equals to the thickness of the dielectric layers 124a and 124b of the dielectric interposers 120a' and 120b'. Furthermore, the package structure P4 includes an insulating layer 142 and bumps 144 partially embedded in the insulating layer 142, wherein the bumps 144 are electrically connected to the bumps 152 and 162.

Figure 6:
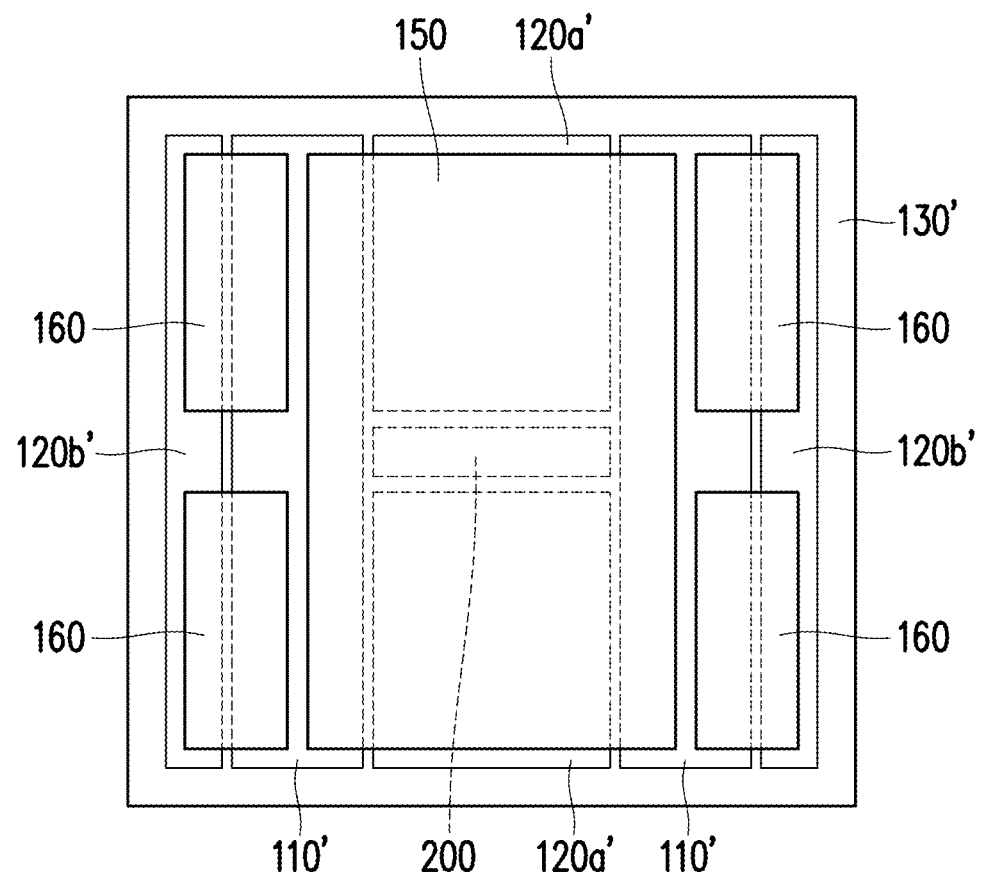
FIGS. 6 and 7 are top views schematically illustrating package structures in accordance with various embodiments of the present disclosure.
Figure 7:
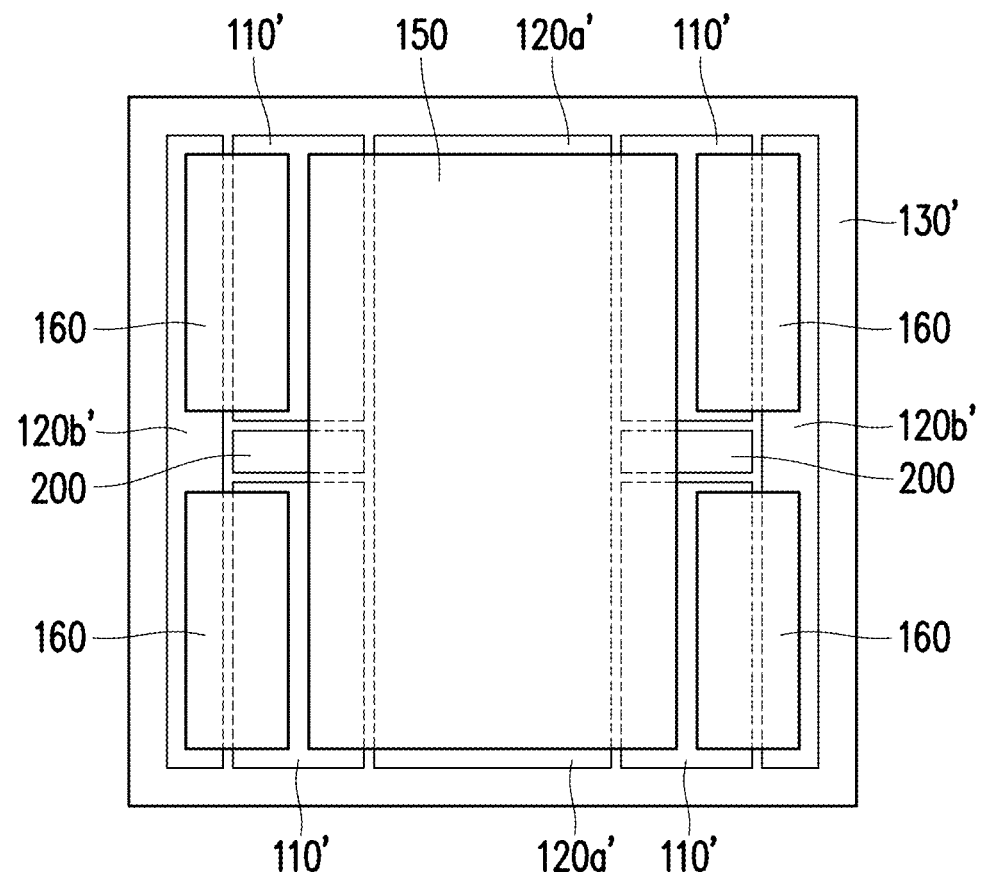

FIGS. 6 and 7 are top views schematically illustrating package structures in accordance with various embodiments of the present disclosure.

Referring to FIG. 5 and FIG. 6, in the package structure P4 according to one embodiment, one passive device 200 and two dielectric interposers 120a' are used, and the passive device 200 is disposed between the two dielectric interposers 120a'. The semiconductor die 150 and the memory devices 160 are stacked over the passive device 200, the semiconductor dies 110', the dielectric interposers 120a' and the dielectric interposers 120b' encapsulated by the insulating encapsulation 130'. When viewing from atop, the passive device 200, the semiconductor dies 110', the dielectric interposers 120a' and the dielectric interposers 120b' are arranged within a rectangular region surrounded by the insulating encapsulation 130'. When viewing from atop, the passive device 200 is merely overlapped with the semiconductor die 150, the semiconductor dies 110' are overlapped with the semiconductor die 150 and the memory devices 160, the dielectric interposers 120a' are merely overlapped with the semiconductor die 150, and the dielectric interposers 120b' are merely overlapped with the memory devices 160. When viewing from atop, the memory devices 160 are overlapped with semiconductor dies 110' and the dielectric interposers 120b', and the semiconductor die 150 is overlapped with the passive device 200, the semiconductor dies 110' and the dielectric interposers 120a'.

Referring to FIG. 5 and FIG. 7, in the package structure P4 according to another embodiment, two passive devices 200 and four semiconductor dies 110' are used, and each one of the passive devices 200 is disposed between two adjacent semiconductor dies 110' respectively. The semiconductor die 150 and the memory devices 160 are stacked over the passive devices 200, the semiconductor dies 110', the dielectric interposers 120a' and the dielectric interposers 120b' encapsulated by the insulating encapsulation 130'. When viewing from atop, the passive devices 200, the semiconductor dies 110', the dielectric interposers 120a' and the dielectric interposers 120b' are arranged within a rectangular region surrounded by the insulating encapsulation 130'. When viewing from atop, the passive devices 200 are merely overlapped with the semiconductor die 150, the semiconductor dies 110' are overlapped with the semiconductor die 150 and the memory devices 160, the dielectric interposers 120a' are merely overlapped with the semiconductor die 150, and the dielectric interposers 120b' are merely overlapped with the memory devices 160. When viewing from atop, the memory devices 160 are overlapped with semiconductor dies 110' and the dielectric interposers 120b', and the semiconductor die 150 is overlapped with the passive devices 200, the semiconductor dies 110' and the dielectric interposers 120a'.

The fabrication of the passive devices 200 is described in accompany with FIG. 8A through FIG. 8I.

FIG. 8A through FIG. 8I are cross-sectional views schematically illustrating a process flow for fabricating a passive device in accordance with some alternative embodiments of the present disclosure.

Figure 8A:
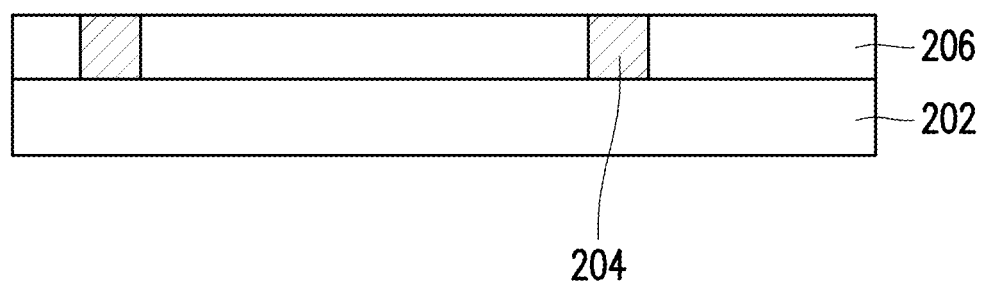
FIG. 8A through FIG. 8I are cross-sectional views schematically illustrating a process flow for fabricating a passive device in accordance with some alternative embodiments of the present disclosure.

Referring to FIG. 8A, a semiconductor substrate 202 is provided, and conductors 204 are formed on the semiconductor substrate 202 through a plating process, for example. In some embodiments, a seed layer is formed on the semiconductor substrate 202 through a sputter process; a patterned photoresist layer is formed over the seed layer and a plating process is performed to form the conductors 204 on the seed layer; the patterned photoresist layer is removed; and the seed layer uncovered by the conductors 204 is removed through an etching process until the semiconductor substrate 202 is revealed.

After forming the conductors 204, a dielectric layer 206 is formed on the semiconductor substrate 202 to laterally encapsulate the conductors 240. In some embodiments, a dielectric material is deposited on the semiconductor substrate 202 to cover the conductors 204, then a CMP process is performed to remove portions of the dielectric material until top surfaces of the conductors 204 are revealed such that a dielectric layer 206 is formed on the semiconductor substrate 202. The top surfaces of the conductors 204 may be substantially leveled with the top surface of the dielectric layer 206. The semiconductor substrate 202 may be a bare silicon substrate and there is no active component (e.g., transistor or the like) and passive component (e.g., resistor, capacitor, inductor, or the like) formed therein. The conductors 204 may be copper pillars or other suitable metallic pillars, and the dielectric layer 206 may be a polyimide (PI) layer, a PBO layer, or a dielectric layer formed by other suitable organic dielectric materials.

Figure 8B:
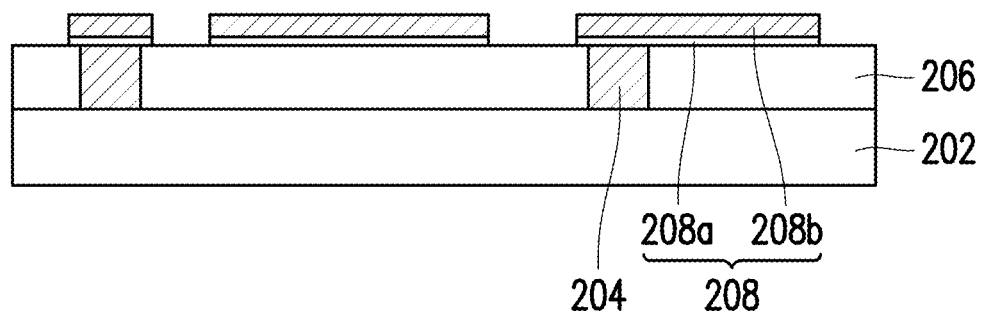

Referring to FIG. 8B, bottom electrodes 208 are formed on the conductors 204 and the dielectric layer 206 through a plating process. In some embodiments, a seed layer 208a is formed on the conductors 204 and the dielectric layer 206 through a sputter process; a patterned photoresist layer is formed over the seed layer 208a and a plating process is performed to form the electrode layers 208b on the seed layer 208a; the patterned photoresist layer is removed; and the seed layer 208a uncovered by the electrode layers 208b is removed through an etching process until the dielectric layer 206 is revealed.

Figure 8C:
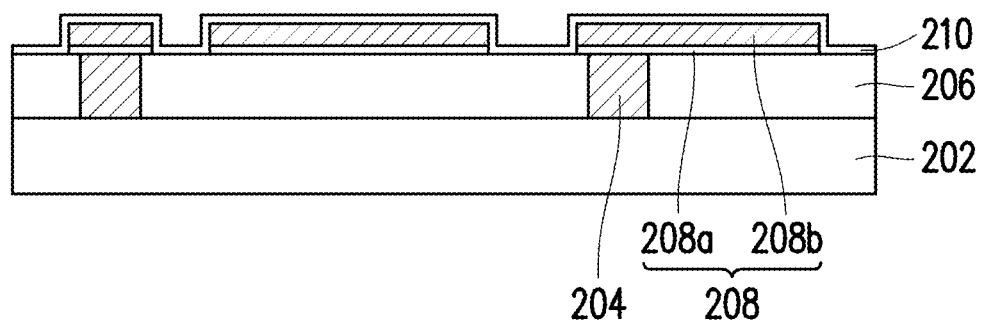
Figure 8D:
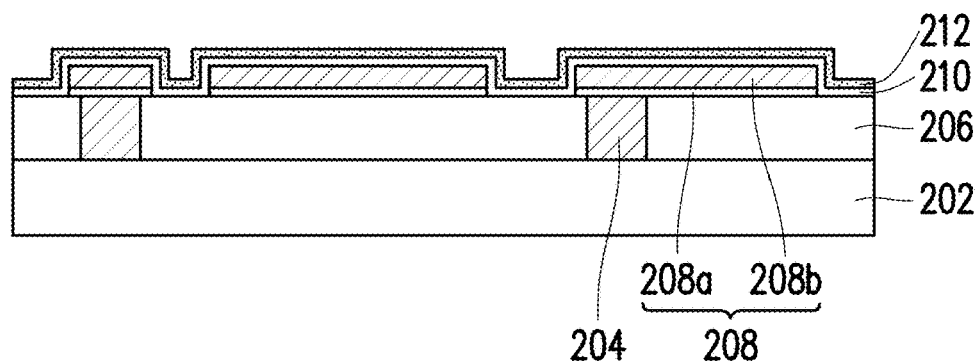

Referring to FIG. 8C and FIG. 8D, a dielectric layer 210 and an upper electrode material layer 212 are formed to cover the dielectric layer 206 and the bottom electrodes 208. In some embodiments, the dielectric layer 210 and the upper electrode material layer 212 are conformally formed over the dielectric layer 206 and the bottom electrodes 208. The material of the dielectric layer 210 may be silicon oxide, silicon nitride or the like, and the material of the upper electrode material layer 212 may be sputtered Ti/Cu layer or other suitable metallic layers.

Figure 8E:
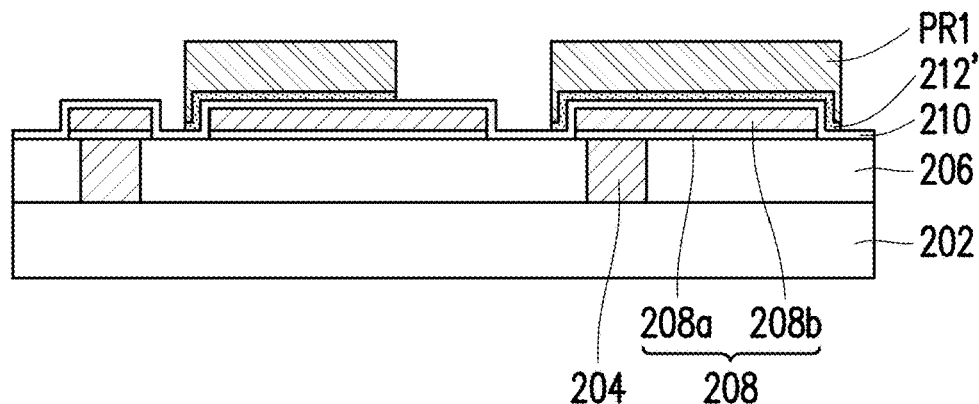

Referring to FIG. 8D and FIG. 8E, a patterned photoresist layer PR1 is formed on the upper electrode material layer 212 and an etching process is performed to remove portions of the upper electrode material layer 212 until the dielectric layer 210 is revealed such that upper electrodes 212' are formed on the dielectric layer 210. Then, the patterned photoresist layer PR1 is removed from the upper electrodes 212'.

Figure 8F:
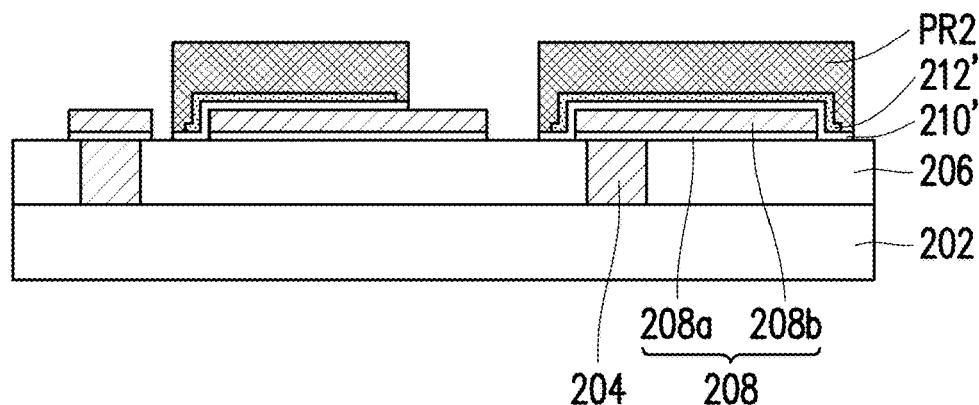

Referring to FIG. 8E and FIG. 8F, a patterned photoresist layer PR2 is formed on the upper electrodes 212' and portions of the dielectric layer 210 uncovered by the upper electrodes 212'. An etching process is performed to remove portions of the dielectric layer 210 until portions of the dielectric layer 206 and portions of the bottom electrodes 208 uncovered by the patterned photoresist layer PR2 are revealed. After the portions of the dielectric layer 210 uncovered by the patterned photoresist layer PR2 are removed, a patterned dielectric layer 210' is formed. Then, the patterned photoresist layer PR2 is removed.

Figure 8G:
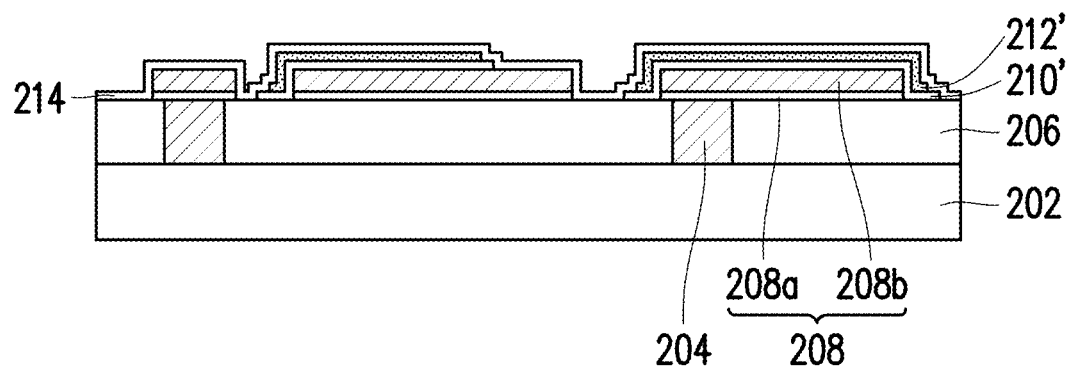
Figure 8H:
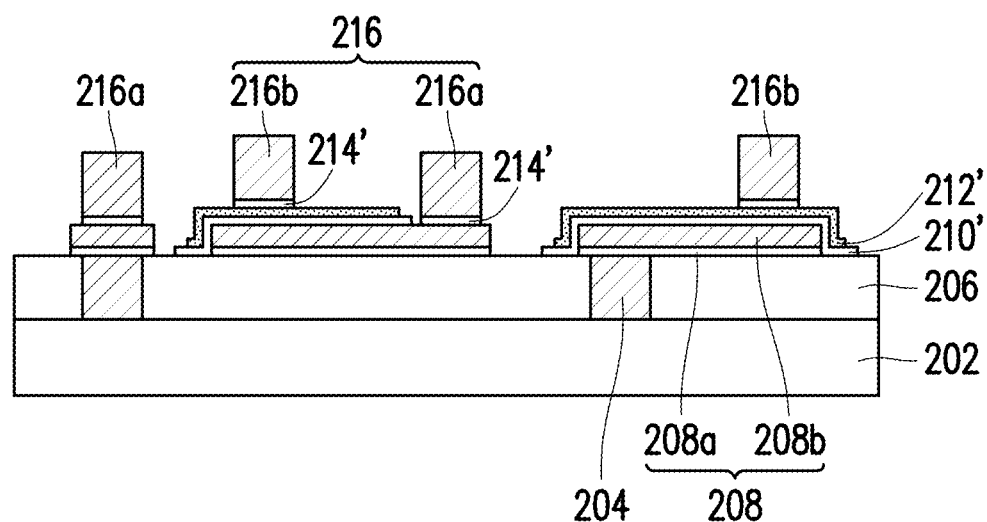

Referring to FIG. 8G and FIG. 8H, a seed layer 214 is formed to cover the dielectric layer 206, the bottom electrodes 208, the patterned dielectric layer 210' and the upper electrodes 212' through a sputter process; a patterned photoresist layer is formed over the seed layer 214 and a plating process is performed to form the conductors 216a and 216b on the seed layer 214; the patterned photoresist layer is removed; and the seed layer 214 uncovered by the conductors 216a and 216b is removed through an etching process such that a patterned seed layer 214' is formed.

Figure 8I:
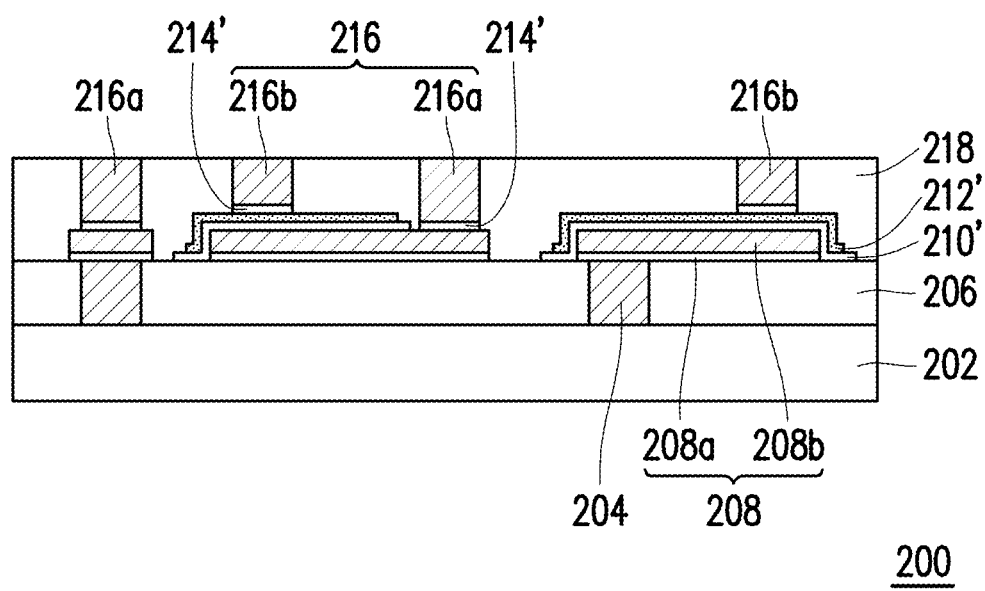

Referring to FIG. 8H and FIG. 8I, after forming the patterned seed layer 214' and the conductors 216a and 216b, a dielectric layer 218 is formed to laterally encapsulate the dielectric layer 206, the bottom electrodes 208, the patterned dielectric layer 210' and the upper electrodes 212' and the conductors 216a and 216b. In some embodiments, a dielectric material is deposited to cover the dielectric layer 206, the bottom electrodes 208, the patterned dielectric layer 210' and the upper electrodes 212' and the conductors 216a and 216b, then a CMP process is performed to remove portions of the dielectric material until top surfaces of the conductors 216a and 216b are revealed. The top surfaces of the conductors 216a and 216b may be substantially leveled with the top surface of the dielectric layer 218. The conductors 216a and 216b may be copper pillars or other suitable metallic pillars, and the dielectric layer 218 may be a polyimide (PI) layer, a PBO layer, or a dielectric layer formed by other suitable organic dielectric materials.

After forming the dielectric layer 218, metal-insulator-metal (MIM) type passive devices 200 are fabricated. However, the present invention is not limited thereto. Other types of passive device, such as fin type passive devices or trench type passive devices, may be utilized in the processes illustrated in FIGS. 1A through 1I and the structures illustrated in FIG. 2 through FIG. 7.

As illustrated in FIG. 5 and FIG. 8I, the passive device 200 included in the package structure P4 may include the semiconductor substrate 202, the conductors 204, the dielectric layer 206, the bottom electrodes 208, the patterned dielectric layer 210', the upper electrodes 212', the seed layer 214', the conductors 216a and 216b and the dielectric layer 218, wherein the conductors 216a and 216b are in contact with and electrically connected to the front side redistribution circuit layer 140. In some other embodiments, the passive device 200 included in the package structure P4 does not include the semiconductor substrate 202, wherein the conductors 204 are in contact with and electrically connected to the back side redistribution circuit layer 180, and the conductors 216a and 216b are in contact with and electrically connected to the front side redistribution circuit layer 140.

In accordance with some embodiments of the disclosure, a structure including a first semiconductor die, an interposer and a first insulating encapsulation is provided. The first semiconductor die includes a semiconductor substrate, an interconnect structure disposed on the semiconductor substrate and conductive vias disposed on the interconnect structure. The interposer includes a dielectric layer and through vias penetrating through the dielectric layer. The first insulating encapsulation laterally encapsulates the first semiconductor die and the interposer, wherein a thickness of the dielectric layer of the interposer substantially equals to a thickness of the first semiconductor die and a thickness of the first insulating encapsulation. In some embodiments, the first semiconductor die further includes a protection layer disposed on the interconnect structure and laterally encapsulating the conductive vias. In some embodiments, the first semiconductor die further includes through semiconductor vias penetrating through the semiconductor substrate, and the through semiconductor vias are electrically connected to the interconnect structure. In some embodiments, the interposer is spaced apart from the first semiconductor die by the first insulating encapsulation. In some embodiments, the structure further includes a first redistribution circuit layer disposed on a first surface of the first insulating encapsulation, an active surface of the first semiconductor die and a first surface of the interposer, wherein the first redistribution circuit layer is electrically connected to the conductive vias of the first semiconductor die and the through vias of the interposer. In some embodiments, the structure further includes a second redistribution circuit layer disposed on a second surface of the first insulating encapsulation, a back surface of the first semiconductor die and a second surface of the interposer, wherein the second redistribution circuit layer is electrically connected to the first redistribution circuit layer through the through vias of the interposer. In some embodiments, the structure further includes a second semiconductor die and a second insulating encapsulation. The second semiconductor die is disposed on and electrically connected to the first redistribution circuit layer, and the second insulating encapsulation is disposed on the first redistribution circuit layer and laterally encapsulating the second semiconductor die. In some embodiments, the structure further includes a passive device embedded in the first insulating encapsulation, wherein a thickness of the passive device substantially equals to the thickness of the dielectric layer of the interposer.

In accordance with some other embodiments of the disclosure, a structure including first semiconductor dies, a first dielectric interposer, a first insulating encapsulation, a first redistribution circuit layer and a second redistribution circuit layer is provided. The first semiconductor dies each includes a semiconductor substrate, an interconnect structure disposed on the semiconductor substrate and conductive vias disposed on the interconnect structure. The first dielectric interposer includes a dielectric layer and through vias penetrating through the dielectric layer, wherein the first semiconductor dies and the first dielectric interposer are arranged side-by-side. The first insulating encapsulation laterally encapsulates the first semiconductor dies and the first dielectric interposer, wherein the through vias are spaced apart from the first insulating encapsulation by the dielectric layer, and a thickness of the dielectric layer of the first dielectric interposer substantially equals to a thickness of the first semiconductor dies and a thickness of the first insulating encapsulation. The first redistribution circuit layer is disposed on a first surface of the first insulating encapsulation, active surfaces of the first semiconductor dies and a first surface of the first dielectric interposer. The second redistribution circuit layer is disposed on a second surface of the first insulating encapsulation, back surfaces of the first semiconductor dies and a second surface of the first dielectric interposer, wherein the first semiconductor dies are electrically connected to the second redistribution circuit layer through the first redistribution circuit layer and the through vias of the first dielectric interposer. In some embodiments, each of the first semiconductor die further includes a protection layer disposed on the interconnect structure and laterally encapsulating the conductive vias. In some embodiments, each of the first semiconductor die further includes through semiconductor vias penetrating through the semiconductor substrate, and the through semiconductor vias are electrically connected to the interconnect structure. In some embodiments, the first dielectric interposer is disposed between the first semiconductor dies. In some embodiments, the first dielectric interposer is spaced apart from the first semiconductor dies by the first insulating encapsulation. In some embodiments, the structure further includes at least one second dielectric interposer, wherein the first dielectric interposer is spaced apart from the at least one second dielectric interposer by at least one of the first semiconductor dies. In some embodiments, the structure further includes a second semiconductor die, a memory device and a second insulating encapsulation. The second semiconductor die is disposed on and electrically connected to the first redistribution circuit layer. The memory device disposed on and electrically connected to the first redistribution circuit layer. The second insulating encapsulation disposed on the first redistribution circuit layer, wherein the second insulating encapsulation laterally encapsulates the second semiconductor die and the memory device. In some embodiments, the structure further includes a passive device embedded in the first insulating encapsulation, wherein the passive device, the first semiconductor dies and the first dielectric interposer are arranged side-by-side, and a thickness of the passive device substantially equals to the thickness of the dielectric layer of the first dielectric interposer.

In accordance with some other embodiments of the disclosure, a method including the followings is provided. A first semiconductor die including a first semiconductor substrate, an interconnect structure disposed on the first semiconductor substrate and conductive vias disposed on the interconnect structure is provided. An interposer die including a second semiconductor substrate, a dielectric layer disposed on the second semiconductor substrate and through vias penetrating the dielectric layer is provided. The first semiconductor die and the interposer die are laterally encapsulated with an insulating material. A thinning process is performed to remove the insulating material, the second semiconductor substrate and a portion of the first semiconductor substrate such that a dielectric interposer encapsulated by a first insulating encapsulation is formed, wherein the dielectric interposer includes the dielectric layer and the through vias, and a thickness of the dielectric layer substantially equals to a thickness of the first semiconductor die and a thickness of the first insulating encapsulation. In some embodiments, the method further includes: before performing the thinning process, forming a first redistribution circuit layer on a surface of the insulating material, an active surface of the first semiconductor die and a surface of the interposer die; mounting a second semiconductor die on the first redistribution circuit layer, wherein the second semiconductor die is electrically connected to the first redistribution circuit layer; and encapsulating the second semiconductor die with a second insulating encapsulation. In some embodiments, the second semiconductor die is mounted on the first redistribution circuit layer through bump joint. In some embodiments, the method further includes: after performing the thinning process, forming a second redistribution circuit layer on a surface of the first insulating encapsulation, a back surface of the first semiconductor die and a surface of the dielectric interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a first semiconductor die;
an interposer comprising a dielectric layer and through vias penetrating through the dielectric layer, wherein the first semiconductor dies and the interposer are arranged side-by-side;
a first insulating encapsulation laterally encapsulating the first semiconductor die and the interposer, wherein a height of the through vias substantially equals to the thickness of the first insulating encapsulation;
a first redistribution circuit layer disposed on a first surface of the first insulating encapsulation, an active surface of the first semiconductor die and a first surface of the interposer; and
a second redistribution circuit layer disposed on a second surface of the first insulating encapsulation, a back surface of the first semiconductor die and a second surface of the interposer.

2. The structure as claimed in claim 1, wherein a height of the dielectric layer substantially equals to the height of the through vias and the thickness of the first insulating encapsulation.

3. The structure as claimed in claim 1, wherein the first semiconductor die comprises a semiconductor substrate, through semiconductor vias penetrating through the semiconductor substrate, an interconnect structure disposed on the semiconductor substrate, conductive vias disposed on the interconnect structure, and a protection layer disposed on the interconnect structure and laterally encapsulating the conductive vias, and the through semiconductor vias are electrically connected to the interconnect structure.

4. The structure as claimed in claim 3, wherein a height of the conductive vias substantially equals to a thickness of the protection layer.

5. The structure as claimed in claim 1,
wherein the first redistribution circuit layer is electrically connected to the first semiconductor die and the through vias of the interposer.

6. The structure as claimed in claim 5,
wherein the second redistribution circuit layer is electrically connected to the first redistribution circuit layer through the through vias of the interposer.

7. The structure as claimed in claim 1 further comprising:
a second semiconductor die disposed on and electrically connected to the first redistribution circuit layer; and
a second insulating encapsulation disposed on the first redistribution circuit layer and laterally encapsulating the second semiconductor die.

8. The structure as claimed in claim 1 further comprising a passive device embedded in the first insulating encapsulation, wherein a thickness of the passive device substantially equals to the thickness of the interposer.

9. A structure, comprising:
first semiconductor dies;
a first interposer disposed aside the first semiconductor dies;
a first insulating encapsulation laterally encapsulating the first semiconductor dies and the first interposer, wherein a thickness of the first interposer substantially equals to a thickness of the first semiconductor dies and a thickness of the first insulating encapsulation;
a redistribution circuit layer disposed on a first surface of the first insulating encapsulation, active surfaces of the first semiconductor dies and a first surface of the first interposer;
a second semiconductor die disposed on and electrically connected to the redistribution circuit layer; and
a second insulating encapsulation disposed on the redistribution circuit layer and laterally encapsulating the second semiconductor die.

10. The structure as claimed in claim 9, wherein each of the first semiconductor die comprises a semiconductor substrate, an interconnect structure disposed on the semiconductor substrate, conductive vias disposed on the interconnect structure, and a protection layer disposed on the interconnect structure and laterally encapsulating the conductive vias.

11. The structure as claimed in claim 10, wherein each of the first semiconductor die further comprises through semiconductor vias penetrating through the semiconductor substrate, and the through semiconductor vias are electrically connected to the interconnect structure.

12. The structure as claimed in claim 9, wherein the first interposer is laterally disposed between the first semiconductor dies.

13. The structure as claimed in claim 9, wherein the first interposer is laterally spaced apart from the first semiconductor dies by the first insulating encapsulation.

14. The structure as claimed in claim 9 further comprising at least one second interposer, wherein the first interposer is laterally spaced apart from the at least one second interposer by at least one of the first semiconductor dies and portions of the first insulating encapsulation.

15. The structure as claimed in claim 9 further comprising:
a memory device disposed on and electrically connected to the redistribution circuit layer, wherein the memory device is laterally encapsulated by the second insulating encapsulation.

16. The structure as claimed in claim 9 further comprising a passive device embedded in the first insulating encapsulation, wherein the passive device, the first semiconductor dies and the first dielectric interposer are arranged side-by-side, and a thickness of the passive device substantially equals to the thickness of the dielectric layer of the first dielectric interposer.

17. A method, comprising:
placing a first semiconductor die and an interposer on a carrier, wherein the interposer comprises a dielectric layer formed on a substrate and through vias penetrating through the dielectric layer, and the interposer is separated from the carrier by the substrate;
laterally encapsulating the first semiconductor die, the interposer and the substrate with an insulating material; and
removing a portion of the insulating material, the substrate and a portion of the first semiconductor die to reveal the dielectric layer and the through vias.

18. The method as claimed in claim 17 further comprising:
before removing the portion of the insulating material, the substrate and the portion of the first semiconductor die, forming a first redistribution circuit layer on a surface of the insulating material, an active surface of the first semiconductor die and a surface of the interposer die;

mounting a second semiconductor die on the first redistribution circuit layer, wherein the second semiconductor die is electrically connected to the first redistribution circuit layer; and encapsulating the second semiconductor die with a second insulating encapsulation.

19. The method as claimed in claim 18, wherein the second semiconductor die is mounted on the first redistribution circuit layer through bump joints.

20. The method as claimed in claim 17 further comprising:

after removing the portion of the insulating material, the substrate and the portion of the first semiconductor die, forming a second redistribution circuit layer on a surface of the first insulating encapsulation, a back surface of the first semiconductor die and a surface of the interposer.

* * * * *